(12) United States Patent
Iravani et al.

(10) Patent No.: US 11,004,708 B2
(45) Date of Patent: May 11, 2021

(54) CORE CONFIGURATION WITH ALTERNATING POSTS FOR IN-SITU ELECTROMAGNETIC INDUCTION MONITORING SYSTEM

(71) Applicant: Applied Materials, Inc., Santa Clara, CA (US)

(72) Inventors: Hassan G. Iravani, Sunnyvale, CA (US); Boguslaw A. Swedek, Cupertino, CA (US); Tzu-Yu Liu, San Jose, CA (US); Kun Xu, Sunol, CA (US); Shih-Haur Shen, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 749 days.

(21) Appl. No.: 15/727,297

(22) Filed: Oct. 6, 2017

(65) Prior Publication Data

US 2018/0122667 A1   May 3, 2018

Related U.S. Application Data

(60) Provisional application No. 62/414,347, filed on Oct. 28, 2016, provisional application No. 62/428,118, filed on Nov. 30, 2016.

(51) Int. Cl.
*H01L 21/67* (2006.01)
*H01L 21/304* (2006.01)
(Continued)

(52) U.S. Cl.
CPC ...... *H01L 21/67253* (2013.01); *B24B 37/013* (2013.01); *B24B 49/02* (2013.01);
(Continued)

(58) Field of Classification Search
CPC ...... G01B 7/105; G01B 7/107; B24B 49/105; B24B 49/10; B24B 37/013; B24B 49/02;
(Continued)

(56) References Cited

U.S. PATENT DOCUMENTS

| 2,608,860 A | 9/1952 | Ramey et al. |
| 2,989,735 A * | 6/1961 | Gumpertz ............. B65G 47/48 360/1 |

(Continued)

FOREIGN PATENT DOCUMENTS

| EP | 1 116 552 | 7/2001 |
| FR | 2 473 168 | 3/1979 |

(Continued)

OTHER PUBLICATIONS

International Search Report and Written Opinion in International Application No. PCT/US2017/055588, dated Jan. 19, 2018, 13 pages.

(Continued)

*Primary Examiner* — Eileen P Morgan
*Assistant Examiner* — Marcel T Dion
(74) *Attorney, Agent, or Firm* — Fish & Richardson P.C.

(57) ABSTRACT

An apparatus for chemical mechanical polishing includes a platen having a surface to support a polishing pad and an electromagnetic induction monitoring system to generate a magnetic field to monitor a substrate being polished by the polishing pad. The electromagnetic induction monitoring system includes a core positioned at least partially in the platen and a coil wound around a portion of the core. The core includes a back portion and a multiplicity of posts extending from the back portion in a first direction normal to the surface of the platen. The core and coil are configured such that the multiplicity of posts include a first plurality of posts to provide a first magnetic polarity and a second (Continued)

plurality of posts to provide an opposite second magnetic polarity, and the first plurality of posts and the second plurality of posts are arranged in an alternating pattern.

18 Claims, 6 Drawing Sheets

(51) Int. Cl.
   *H01L 21/66*    (2006.01)
   *B24B 49/10*    (2006.01)
   *G01B 7/06*     (2006.01)
   *B24B 49/02*    (2006.01)
   *B24B 37/013*   (2012.01)
   *G01N 27/90*    (2021.01)

(52) U.S. Cl.
   CPC ............ *B24B 49/10* (2013.01); *B24B 49/105* (2013.01); *G01B 7/107* (2013.01); *H01L 21/304* (2013.01); *H01L 22/14* (2013.01); *G01N 27/9006* (2013.01); *H01L 22/26* (2013.01)

(58) Field of Classification Search
   CPC .............. G01N 27/025; G01N 27/9006; H01L 21/67253; H01L 21/304; H01L 22/14; H01L 22/26
   USPC ........ 324/229–232; 451/5, 6, 8–11, 41, 285, 451/288
   See application file for complete search history.

(56) References Cited

U.S. PATENT DOCUMENTS

| | | | |
|---|---|---|---|
| 4,000,458 A | 12/1976 | Miller et al. | |
| 4,005,359 A | 1/1977 | Smoot | |
| 4,303,885 A | 12/1981 | Davis et al. | |
| 4,379,261 A * | 4/1983 | Lakin | G01N 27/904 |
| | | | 324/232 |
| 4,467,281 A | 8/1984 | Davis et al. | |
| 4,556,845 A | 12/1985 | Strope et al. | |
| 4,715,007 A | 12/1987 | Fujita et al. | |
| 4,716,366 A | 12/1987 | Hosoe et al. | |
| 4,771,238 A | 9/1988 | Caruso et al. | |
| 4,829,251 A | 5/1989 | Fischer | |
| 5,003,262 A | 3/1991 | Egner et al. | |
| 5,111,412 A * | 5/1992 | Tornblom | G01N 27/9046 |
| | | | 324/202 |
| 5,142,228 A | 8/1992 | Kingsbury | |
| 5,213,655 A | 5/1993 | Leach et al. | |
| 5,237,271 A | 8/1993 | Hedengren | |
| 5,343,146 A | 8/1994 | Koch et al. | |
| 5,355,083 A | 10/1994 | George et al. | |
| 5,399,968 A * | 3/1995 | Sheppard | G01N 27/902 |
| | | | 324/232 |
| 5,541,510 A | 7/1996 | Danielson | |
| 5,554,933 A * | 9/1996 | Logue | B82Y 15/00 |
| | | | 324/233 |
| 5,559,428 A | 9/1996 | Li et al. | |
| 5,570,017 A | 10/1996 | Blum | |
| 5,644,221 A | 7/1997 | Li et al. | |
| 5,648,721 A * | 7/1997 | Wincheski | G01N 27/902 |
| | | | 324/209 |
| 5,660,672 A | 8/1997 | Li et al. | |
| RE35,703 E | 12/1997 | Koch et al. | |
| 5,731,697 A | 3/1998 | Li et al. | |
| 6,057,684 A | 5/2000 | Murakami et al. | |
| 6,072,320 A | 6/2000 | Verkuil | |
| 6,232,775 B1 | 5/2001 | Naitoh et al. | |
| 6,435,948 B1 | 8/2002 | Molnar | |
| 6,636,037 B1 * | 10/2003 | Ou-Yang | G01N 27/902 |
| | | | 324/232 |
| 6,707,540 B1 | 3/2004 | Lehman et al. | |
| 6,741,076 B2 | 5/2004 | Le | |
| 7,112,960 B2 | 9/2006 | Miller et al. | |
| 7,112,961 B2 | 9/2006 | Lei et al. | |
| 7,128,803 B2 | 10/2006 | Owczarz et al. | |
| 7,255,630 B2 | 8/2007 | Elledge | |
| 7,626,383 B1 * | 12/2009 | Sun | G01N 27/82 |
| | | | 324/232 |
| 8,148,976 B2 * | 4/2012 | Thess | G01N 27/9026 |
| | | | 324/164 |
| 8,284,560 B2 | 10/2012 | Iravani et al. | |
| 10,391,610 B2 | 8/2019 | Iravani et al. | |
| 2002/0047705 A1 | 4/2002 | Tada et al. | |
| 2002/0077031 A1 | 6/2002 | Johansson et al. | |
| 2003/0148706 A1 | 8/2003 | Birang et al. | |
| 2004/0140797 A1 | 7/2004 | Lei et al. | |
| 2004/0150500 A1 | 8/2004 | Kiko | |
| 2004/0207395 A1 | 10/2004 | Sarfaty et al. | |
| 2006/0000098 A1 | 1/2006 | Hanawa et al. | |
| 2007/0103150 A1 | 5/2007 | Tada et al. | |
| 2008/0003936 A1 | 1/2008 | Swedek et al. | |
| 2008/0139087 A1 * | 6/2008 | Togawa | B24B 49/105 |
| | | | 451/8 |
| 2010/0124792 A1 * | 5/2010 | Iravani | H01L 22/12 |
| | | | 438/17 |
| 2013/0241541 A1 * | 9/2013 | Endo | G01N 27/87 |
| | | | 324/232 |
| 2013/0260645 A1 * | 10/2013 | Takahashi | B24B 49/105 |
| | | | 451/8 |
| 2015/0371907 A1 | 12/2015 | Lu et al. | |

FOREIGN PATENT DOCUMENTS

| | | |
|---|---|---|
| WO | WO 01/46684 | 6/2001 |
| WO | WO 2014/144861 | 9/2014 |

OTHER PUBLICATIONS

G.L. Miller et al., "Contactless measurement of semiconductor conductivity by radio frequency-free-carrier power absorption," in final form, Mar. 24, 1976; Review of Scientific Instruments, vol. 47, No. 7, Jul. 1976; Copyright © 1976 American Institute of Physics, pp. 799-805.

* cited by examiner

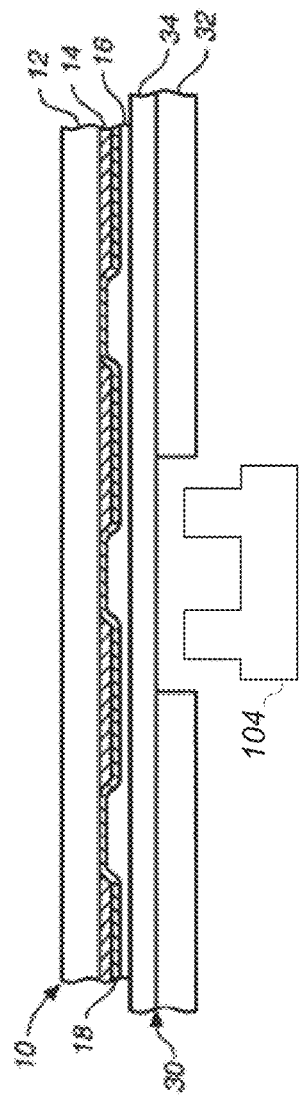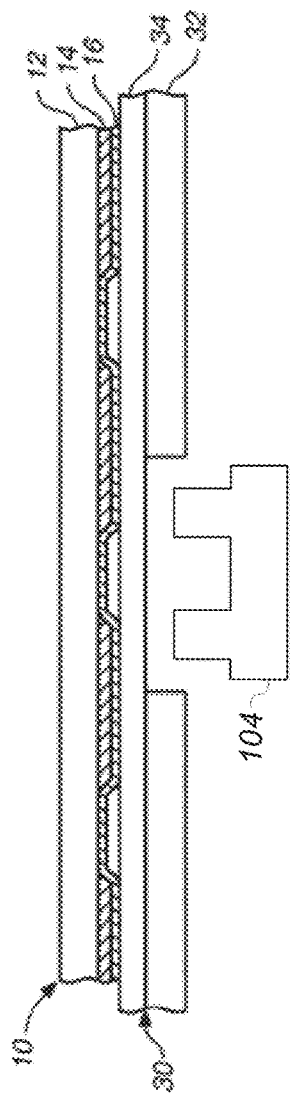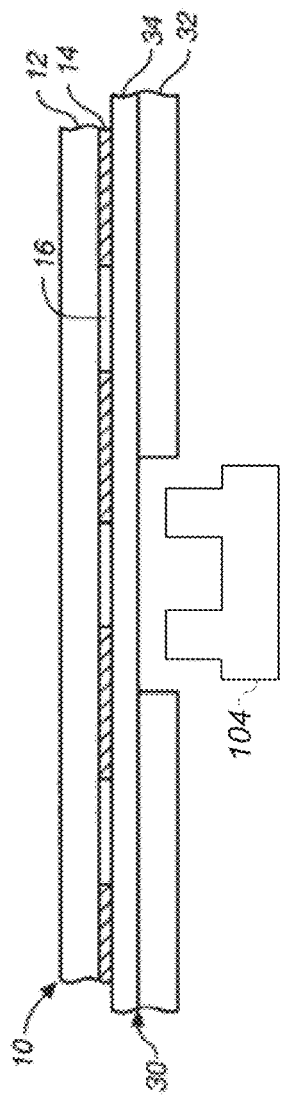

CORE CONFIGURATION WITH ALTERNATING POSTS FOR IN-SITU ELECTROMAGNETIC INDUCTION MONITORING SYSTEM

CROSS-REFERENCE TO RELATED APPLICATIONS

This application claims priority to U.S. Provisional Application Ser. No. 62/414,347, filed on Oct. 28, 2016, and claims priority to U.S. Provisional Application Ser. No. 62/428,118, filed Nov. 30, 2016, each of which is incorporated by reference.

TECHNICAL FIELD

The present disclosure relates to electromagnetic induction monitoring, e.g., eddy current monitoring, during processing of a substrate.

BACKGROUND

An integrated circuit is typically formed on a substrate (e.g. a semiconductor wafer) by the sequential deposition of conductive, semiconductive or insulative layers on a silicon wafer, and by the subsequent processing of the layers.

One fabrication step involves depositing a filler layer over a non-planar surface, and planarizing the filler layer until the non-planar surface is exposed. For example, a conductive filler layer can be deposited on a patterned insulative layer to fill the trenches or holes in the insulative layer. The filler layer is then polished until the raised pattern of the insulative layer is exposed. After planarization, the portions of the conductive layer remaining between the raised pattern of the insulative layer form vias, plugs and lines that provide conductive paths between thin film circuits on the substrate. In addition, planarization may be used to planarize the substrate surface for lithography.

Chemical mechanical polishing (CMP) is one accepted method of planarization. This planarization method typically requires that the substrate be mounted on a carrier head. The exposed surface of the substrate is placed against a rotating polishing pad. The carrier head provides a controllable load on the substrate to push it against the polishing pad. A polishing liquid, such as slurry with abrasive particles, is supplied to the surface of the polishing pad.

During semiconductor processing, it may be important to determine one or more characteristics of the substrate or layers on the substrate. For example, it may be important to know the thickness of a conductive layer during a CMP process, so that the process may be terminated at the correct time. A number of methods may be used to determine substrate characteristics. For example, optical sensors may be used for in-situ monitoring of a substrate during chemical mechanical polishing. Alternately (or in addition), an eddy current sensing system may be used to induce eddy currents in a conductive region on the substrate to determine parameters such as the local thickness of the conductive region.

SUMMARY

In one aspect, an apparatus for chemical mechanical polishing includes a platen having a surface to support a polishing pad and an electromagnetic induction monitoring system to generate a magnetic field to monitor a substrate being polished by the polishing pad. The electromagnetic induction monitoring system includes a core positioned at least partially in the platen and a coil wound around a portion of the core. The core includes a back portion and a multiplicity of posts extending from the back portion in a first direction normal to the surface of the platen. The core and coil are configured such that the multiplicity of posts comprise a first plurality of posts to provide a first magnetic polarity and a second plurality of posts to provide an opposite second magnetic polarity, and the first plurality of posts and the second plurality of posts are arranged in an alternating pattern.

Implementations may include one or more of the following features.

The multiplicity of posts may be evenly divided between the first plurality of posts and the second plurality of posts. The multiplicity of posts may be uniformly spaced along a path that forms a closed loop. The multiplicity of posts may be positioned at vertices of a regular polygon. The multiplicity of posts may be four posts and the polygon may be a square, or the multiplicity of posts may be six posts and the polygon may be a hexagon. The multiplicity of posts may be positioned along line segments of a rectangle. Each post may be equidistant from two or more adjacent posts, e.g., exactly two posts, having an opposite magnetic polarity.

The multiplicity of posts may have the same height and cross-sectional shape.

The coil may include a plurality of coil portions, and each coil portion of the plurality of coil portions may be wound around a different post of the multiplicity of posts. The plurality of coil portions may include one or more first coil portions wound around one or more of the first plurality of posts and one or more second coil portions wound around one or more of the second plurality of posts. The first coil portions and the second coil portions may be wound in opposite directions. Each post of the plurality of posts may have an associated coil portion.

The electromagnetic induction monitoring system may include a plurality of winding assemblies, each winding assembly may include a coil portion wound around a post, each pair of adjacent posts may be separated by a gap, each winding assembly may be a cylindrical body surrounding a post, and a total of the widths of one or more winding assemblies may be at least 80% of a width of a gap. The total of the widths of one or more winding assemblies may be at least 90% of the width of the gap. A pair of winding assemblies may surround a pair of adjacent posts such that the pair of winding assemblies both fit into the gap between the pair of adjacent posts. Each winding assembly may include a bobbin, the coil may be wound around the bobbin, and an inner surface of the bobbin may provide an inner diameter of the winding assembly. The winding assembly may include a tape contacting and surrounding the coil portion, and an outer surface of the tape may provides an outer diameter of the winding assembly. Certain implementations can include one or more of the following advantages. Spatial resolution of the eddy current sensor can be improved. The eddy current sensor can be configured for monitoring of conductive features that have a high impedance, e.g., metal sheets formed of a low conductance metal such as titanium or cobalt, metal residue, or metal lines.

The details of one or more implementations are set forth in the accompanying drawings and the description below. Other aspects, features and advantages will be apparent from the description and drawings, and from the claims.

BRIEF DESCRIPTION OF DRAWINGS

FIGS. 3A-3C are schematic cross-sectional side views illustrating a method of polishing a substrate.

Like reference symbols in the various drawings indicate like elements.

DETAILED DESCRIPTION

A CMP system can use an eddy current monitoring system to detect the thickness of a metal layer on a substrate during polishing. During polishing of the metal layer, the eddy current monitoring system can determine the thickness of the metal layer in different regions of the substrate. The thickness measurements can be used to detect the polishing endpoint or to adjust processing parameters of the polishing process in real time to reduce polishing non-uniformity.

One issue with eddy current monitoring is that the eddy current is induced in the conductive layer in a region whose size depends on the spread of the magnetic field; the greater the spread of the magnetic field, the lower the resolution of the eddy current monitoring system. With ever increasing demands of integrated circuit fabrication, there is a need for increased spatial resolution of the eddy current sensor, e.g., in order to provide improved control of the polishing parameters. Appropriate selection of the physical configuration of the magnetic core can reduce the spread of the magnetic field and provide improved resolution. In particular, the magnetic core can include a plurality of posts that form a pattern of alternating magnetic polarities.

Figure 1:
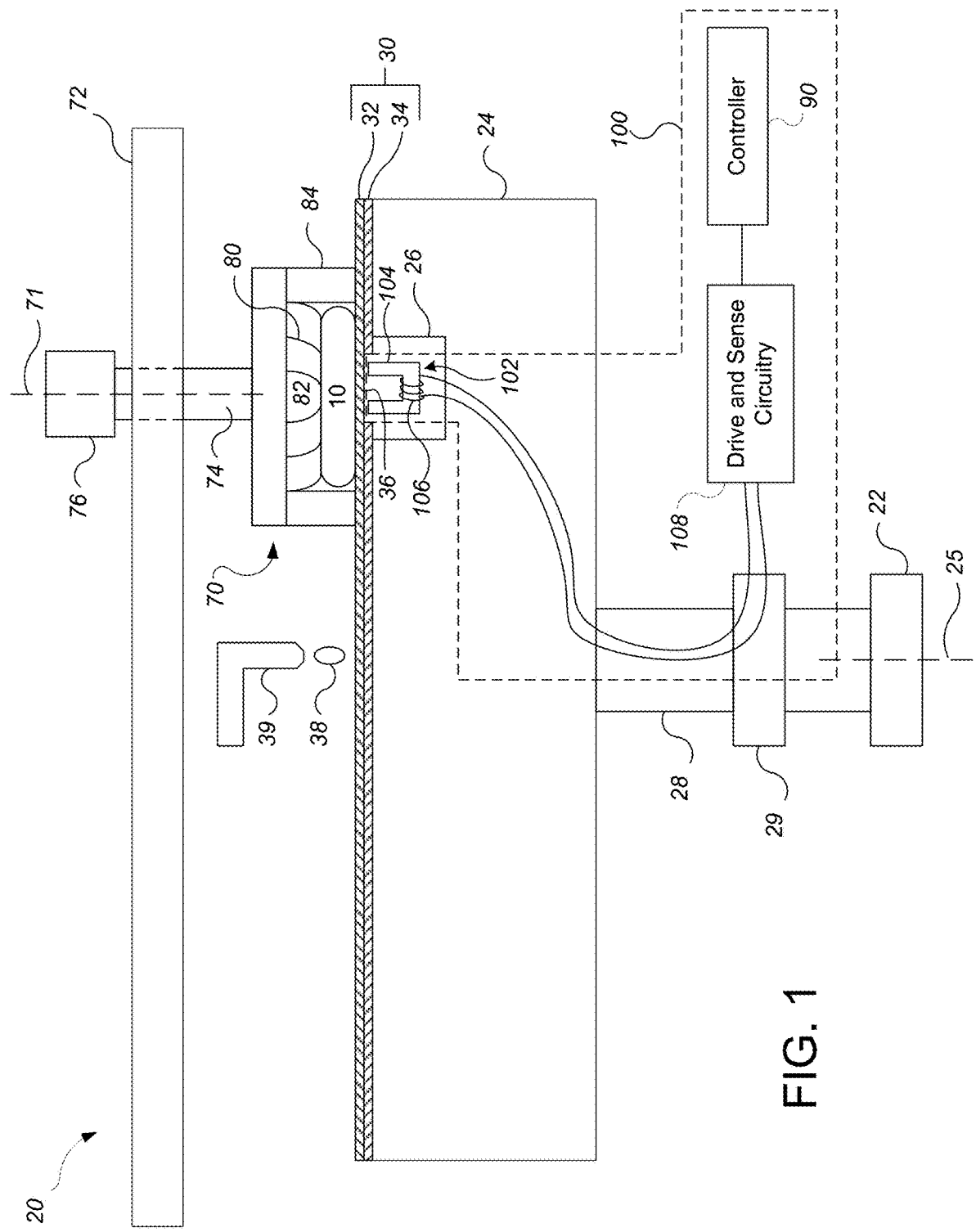
FIG. 1 is a schematic side view, partially cross-sectional, of a chemical mechanical polishing station that includes an electromagnetic induction monitoring system.
Figure 2:
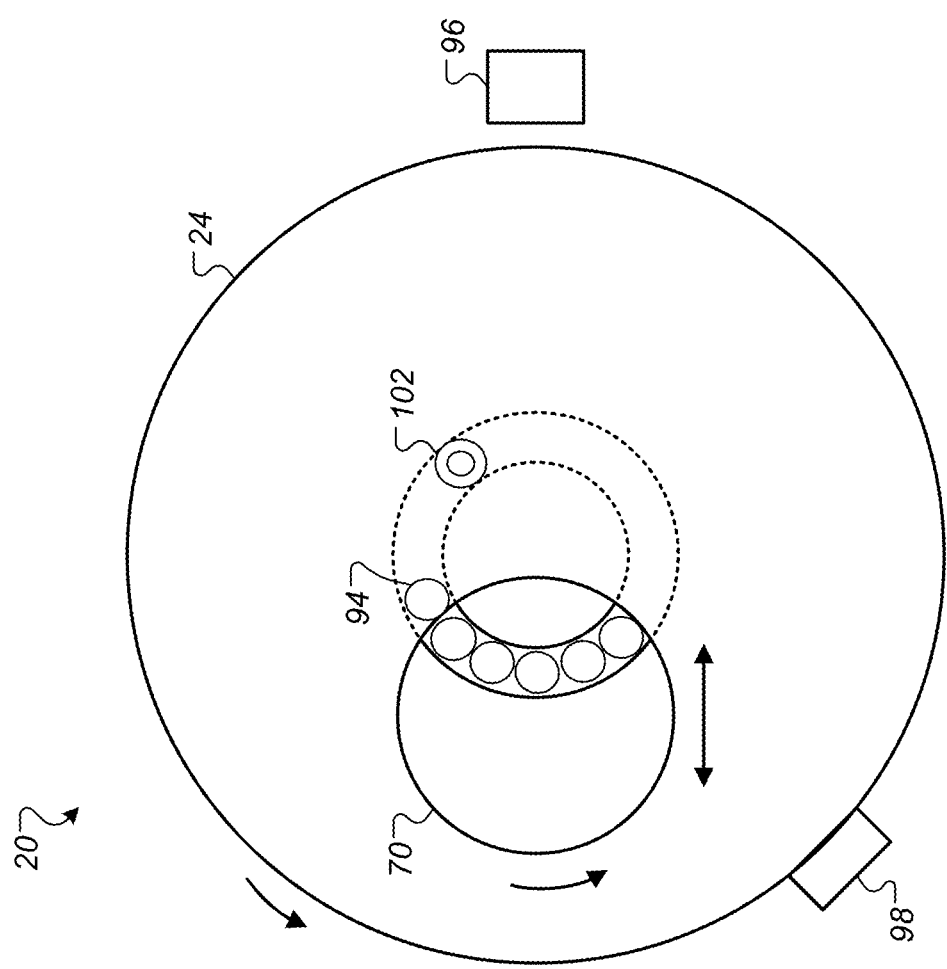
FIG. 2 is a schematic top view of the chemical mechanical polishing station of FIG. 1.

FIGS. 1 and 2 illustrate an example of a polishing station 20 of a chemical mechanical polishing apparatus. The polishing station 20 includes a rotatable disk-shaped platen 24 on which a polishing pad 30 is situated. The platen 24 is operable to rotate about an axis 25. For example, a motor 22 can turn a drive shaft 28 to rotate the platen 24. The polishing pad 30 can be a two-layer polishing pad with an outer polishing layer 34 and a softer backing layer 32.

The polishing station 22 can include a supply port or a combined supply-rinse arm 39 to dispense a polishing liquid 38, such as slurry, onto the polishing pad 30. The polishing station 22 can include a pad conditioner apparatus with a conditioning disk to maintain the surface roughness of the polishing pad.

The carrier head 70 is operable to hold a substrate 10 against the polishing pad 30. The carrier head 70 is suspended from a support structure 72, e.g., a carousel or a track, and is connected by a drive shaft 74 to a carrier head rotation motor 76 so that the carrier head can rotate about an axis 71. Optionally, the carrier head 70 can oscillate laterally, e.g., on sliders on the carousel or track 72; or by rotational oscillation of the carousel itself.

In operation, the platen is rotated about its central axis 25, and the carrier head is rotated about its central axis 71 and translated laterally across the top surface of the polishing pad 30. Where there are multiple carrier heads, each carrier head 70 can have independent control of its polishing parameters, for example each carrier head can independently control the pressure applied to each respective substrate.

The carrier head 70 can include a flexible membrane 80 having a substrate mounting surface to contact the back side of the substrate 10, and a plurality of pressurizable chambers 82 to apply different pressures to different zones, e.g., different radial zones, on the substrate 10. The carrier head can also include a retaining ring 84 to hold the substrate.

A recess 26 is formed in the platen 24, and optionally a thin section 36 can be formed in the polishing pad 30 overlying the recess 26. The recess 26 and thin pad section 36 can be positioned such that regardless of the translational position of the carrier head they pass beneath substrate 10 during a portion of the platen rotation. Assuming that the polishing pad 30 is a two-layer pad, the thin pad section 36 can be constructed by removing a portion of the backing layer 32, and optionally by forming a recess in the bottom of the polishing layer 34. The thin section can optionally be optically transmissive, e.g., if an in-situ optical monitoring system is integrated into the platen 24.

Referring to FIG. 3A, the polishing system 20 can be used to polish a substrate 10 that includes a conductive material overlying and/or inlaid in a patterned dielectric layer. For example, the substrate 10 can include a layer of conductive material 16, e.g., a metal, e.g., copper, aluminum, cobalt or titanium, that overlies and fills trenches in a dielectric layer 14, e.g., silicon oxide or a high-k dielectric. Optionally a barrier layer 18, e.g., tantalum or tantalum nitride, can line the trenches and separate the conductive material 16 from the dielectric layer 14. The conductive material 16 in the trenches can provide vias, pads and/or interconnects in a completed integrated circuit. Although the dielectric layer 14 is illustrated as deposited directly on a semiconductor wafer 12, one or more other layers can be interposed between the dielectric layer 14 and the wafer 12.

Initially, the conductive material 16 overlies the entire dielectric layer 14. As polishing progresses, the bulk of the conductive material 16 is removed, exposing the barrier layer 18 (see FIG. 3B). Continued polishing then exposes the patterned top surface of the dielectric layer 14 (see FIG. 3C). Additional polishing can then be used to control the depth of the trenches that contain the conductive material 16.

Returning to FIG. 1, the polishing system 20 includes an in-situ electromagnetic induction monitoring system 100 which can be coupled to or be considered to include a controller 90. A rotary coupler 29 can be used to electrically connect components in the rotatable platen 24, e.g., the sensors of the in-situ monitoring systems, to components outside the platen, e.g., drive and sense circuitry or the controller 90.

The in-situ electromagnetic induction monitoring system 100 is configured to generate a signal that depends on a depth of the conductive material 16, e.g., the metal. The electromagnetic induction monitoring system can operate either by generation of eddy-currents in the conductive material, which can be either the sheet of conductive material that overlies the dielectric layer or the conductive material remaining in trenches after the dielectric layer is exposed, or generation of current in a conductive loop formed in a trench in the dielectric layer on the substrate.

In operation, the polishing system 20 can use the in-situ monitoring system 100 to determine when the conductive layer has reached a target thickness, e.g., a target depth for metal in a trench or a target thickness for a metal layer overlying the dielectric layer, and then halts polishing. Alternatively or in addition, the polishing system 20 can use the in-situ monitoring system 100 to determine differences in thickness of the conductive material 16 across the substrate 10, and use this information to adjust the pressure in one or more chambers 82 in the carrier head 80 during polishing in order to reduce polishing non-uniformity.

The in-situ monitoring system 100 can include a sensor 102 installed in a recess 26 in the platen 24. The sensor 102 can include a magnetic core 104 positioned at least partially in the recess 26, and at least one coil 106 wound around a portion of the core 104. Drive and sense circuitry 108 is electrically connected to the coil 106. The drive and sense circuitry 108 generates a signal that can be sent to the controller 90. Although illustrated as outside the platen 24, some or all of the drive and sense circuitry 108 can be installed in the platen 24.

Referring to FIG. 2, as the platen 24 rotates, the sensor 102 sweeps below the substrate 10. By sampling the signal from the circuitry 108 at a particular frequency, the circuitry 108 generates measurements at a sequence of sampling zones 94 across the substrate 10. For each sweep, measurements at one or more of the sampling zones 94 can be selected or combined. Thus, over multiple sweeps, the selected or combined measurements provide the time-varying sequence of values.

The polishing station 20 can also include a position sensor 96, such as an optical interrupter, to sense when the sensor 102 is underneath the substrate 10 and when the sensor 102 is off the substrate. For example, the position sensor 96 can be mounted at a fixed location opposite the carrier head 70. A flag 98 can be attached to the periphery of the platen 24. The point of attachment and length of the flag 98 is selected so that it can signal the position sensor 96 when the sensor 102 sweeps underneath the substrate 10.

Alternately or in addition, the polishing station 20 can include an encoder to determine the angular position of the platen 24.

Returning to FIG. 1, a controller 90, e.g., a general purpose programmable digital computer, receives the signals from sensor 102 of the in-situ monitoring system 100. Since the sensor 102 sweeps beneath the substrate 10 with each rotation of the platen 24, information on the depth of the conductive layer, e.g., the bulk layer or conductive material in the trenches, is accumulated in-situ (once per platen rotation). The controller 90 can be programmed to sample measurements from the in-situ monitoring system 100 when the substrate 10 generally overlies the sensor 102.

In addition, the controller 90 can be programmed to calculate the radial position of each measurement, and to sort the measurements into radial ranges.

Figure 4:
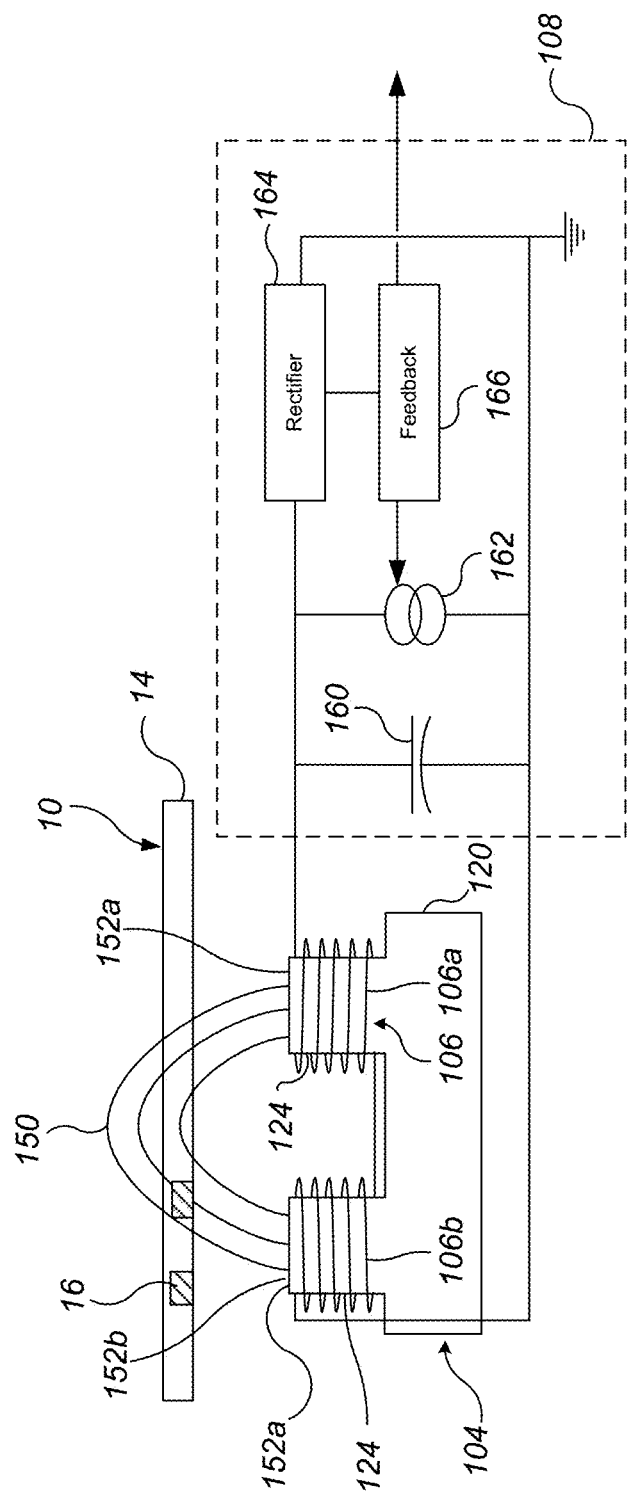
FIG. 4 is a schematic circuit diagram of a drive system for an electromagnetic induction monitoring system.

FIG. 4 illustrates an example of the drive and sense circuitry 108. The circuitry 108 applies an AC current to the coil 106, which generates a magnetic field 150 between two poles 152a and 152b of the core 104. In operation, when the substrate 10 intermittently overlies the sensor 104, a portion of the magnetic field 150 extends into the substrate 10.

The circuitry 108 can include a capacitor 160 connected in parallel with the coil 106. Together the coil 106 and the capacitor 160 can form an LC resonant tank. In operation, a current generator 162 (e.g., a current generator based on a marginal oscillator circuit) drives the system at the resonant frequency of the LC tank circuit formed by the coil 106 (with inductance L) and the capacitor 160 (with capacitance C). The current generator 162 can be designed to maintain the peak to peak amplitude of the sinusoidal oscillation at a constant value. A time-dependent voltage with amplitude V0 is rectified using a rectifier 164 and provided to a feedback circuit 166. The feedback circuit 166 determines a drive current for current generator 162 to keep the amplitude of the voltage V0 constant. Marginal oscillator circuits and feedback circuits are further described in U.S. Pat. Nos. 4,000,458, and 7,112,960.

As an eddy current monitoring system, the electromagnetic induction monitoring system 100 can be used to monitor the thickness of a conductive layer by inducing eddy currents in the conductive sheet, or to monitor the depth of a conductive material in a trench by inducing eddy currents in the conductive material. Alternatively, as an inductive monitoring system, the electromagnetic induction monitoring system can operate by inductively generating a current in a conductive loop formed in the dielectric layer 14 of the substrate 10 for the purpose of monitoring, e.g., as described in U.S. Patent Publication No. 2015-0371907, which is incorporated by reference in its entirety.

If monitoring of the thickness of a conductive layer on the substrate is desired, then when the magnetic field 150 reaches the conductive layer, the magnetic field 150 can pass through and generate a current (if the target is a loop) or create an eddy-current (if the target is a sheet). This creates an effective impedance, thus increasing the drive current required for the current generator 162 to keep the amplitude of the voltage V0 constant. The magnitude of the effective impedance depends on the thickness of the conductive layer. Thus, the drive current generated by the current generator 162 provides a measurement of the thickness of the conductive layer being polished.

Other configurations are possible for the drive and sense circuitry 108. For example, separate drive and sense coils could be wound around the core, the drive coil could be driven at a constant frequency, and the amplitude or phase (relative to the driving oscillator) of the current from the sense coil could be used for the signal.

Figure 5B:
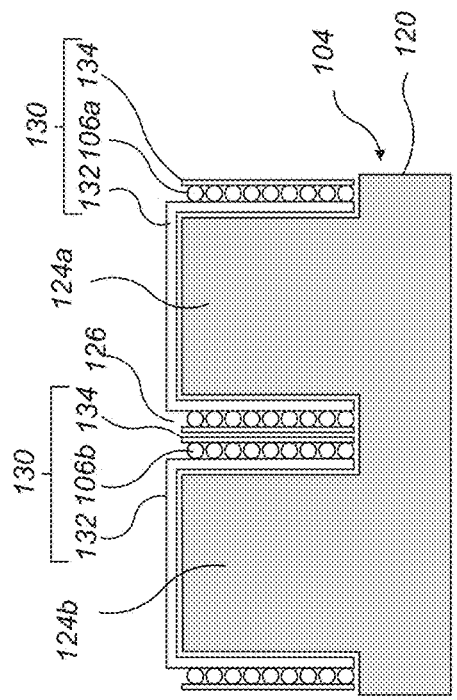
FIGS. 5B and 5C are schematic cross-sectional views from FIG. 5A along lines 5B-5B and 5C-5C, respectively.
Figure 5C:
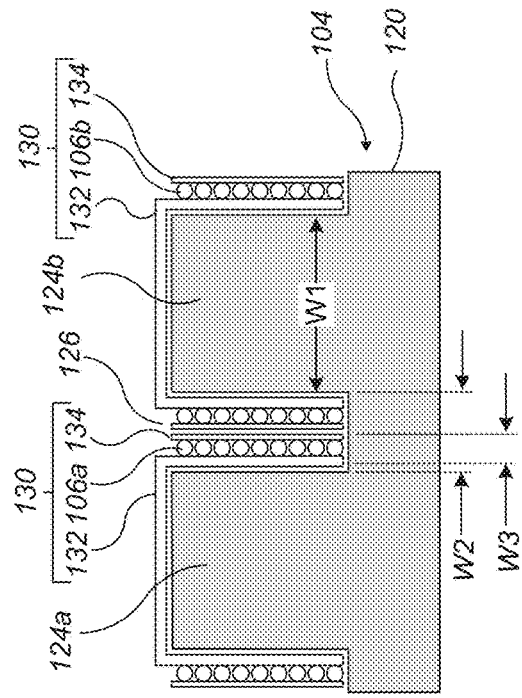
Figure 5A:
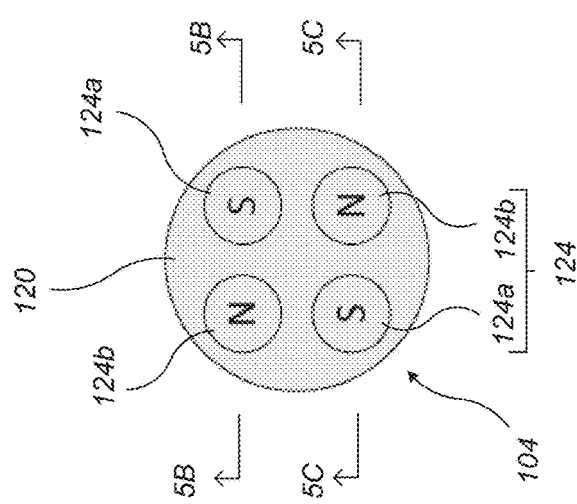
FIG. 5A is a schematic top view of a core of the electromagnetic induction monitoring system.

FIGS. 5A-5C illustrate an example of a core 104 for the in-situ monitoring system 100. The core 104 has a body formed of a non-conductive material with a relatively high magnetic permeability (e.g., μ of about 2500 or more). Specifically, the core 104 can be nickel-zinc ferrite.

In some implementations, the core 104 is coated with a protective layer. For example, the core 104 can be coated with a material such as parylene to prevent water from entering pores in the core 104, and to prevent coil shorting.

The core 104 includes a plurality of posts 124, and in conjunction with the coil 106 the posts provide a pattern of alternating magnetic polarities. The core 104 includes a back portion 120, and at least four posts 124 that extend from the back portion 120. The posts 124 can extend from the back portion 120 in a first direction that is normal to the top surface of the platen 24 (or to the polishing surface of the polishing pad when placed on the platen 24). The posts 124 can extend in parallel. The posts 124 can have the same height (measured along a direction normal to the top surface of the platen or the surface of the polishing pad).

The plurality of posts 124 include at least two posts 124a to provide a first magnetic polarity and at least two posts 124b to provide the opposite second magnetic polarity. In some implementations, there is an even number of posts 124, with the posts evenly divided between posts providing the first magnetic polarity and the posts providing the second magnetic polarity.

The coil 106 is wound around one or more of the posts 124. In some implementations, the coil 106 is wound around each of the posts 124. Referring to FIG. 4, the coil 106 can include a first coil portion 106a wound around the posts 124a and a second coil portion 106b wound around the posts 124b. The first coil portion 106a can be wound in the opposite direction as the second coil portion 106b so that the magnetic fields generated by the coil portions are additive rather than opposing. In some implementations the coil 106 is wound around less than all of the posts, e.g., the coil 106 is wound around just the posts 124a that provide the first magnetic polarity.

In some implementations, the core 104 can be a permanent magnet to provide. For example, the posts 124a can provide the south pole of the core 104 and the posts 124b can provide the north pole of the core 104.

Instead of the core 104 itself having a polarity, the core 104 may be a high permeability low coercivity body, and the coil may include coil portions wound around at least two posts 124a and coil portions wound in an opposite direction around at least two other posts 124b. The coil portions can be wound in opposite directions on alternating posts. In this case, the posts 124a and 124b still generate opposite polarity magnetic fields (relative to a horizontal plane that passes through the top of the posts), but because of the windings rather than the permanent magnetism. In some implementations the coil 106 is wound around less than all of the posts, e.g., the coil 106 is wound around just the posts 124a that provide the first magnetic polarity.

Referring to FIGS. 5A and 5B, each coil portion can be part of a winding assembly 130 that fits around a post 124. The winding assembly 130 includes at least the coil portion, e.g., coil portion 106a or 106b, which is wound around the post 124a or 124b, respectively, of the core 104. The winding assembly 130 can also include a bobbin 132. The bobbin 132 fits around the post 124, and the coil portion is wound around the bobbin 132. The bobbin 132 can also include a cap that rests against the top surface of the post 124 to set the vertical position of the coil portion. This permits easier assembly of the sensor 102. The bobbin can be a dielectric material, e.g., a plastic.

The winding assembly 130 can also include a tape 134 that covers the outer surface of the coil portion, e.g., to protect the coil 106. In order to reduce the area needed for the gap, the coil portion for each winding assembly 130 can have just one or two layers of windings.

The back portion 120 of the core 106 can be a generally planar body and can have a top face parallel to the top surface of the platen, e.g., parallel to the substrate and the polishing pad during the polishing operation. The back portion 120 can have a height that is measured normal to the top surface of the platen. The posts 124 can extend from the back portion 120 in a direction normal to a top surface of the back portion.

Referring to FIG. 5A, in some implementations, the posts are positioned such that each post is equidistant from adjacent two posts having the opposite polarity. These two posts can be the two posts closest to the particular post. For example, each post 124a can be equidistant from two adjacent posts 124b. The posts can be positioned in a pattern such that each of the posts is equidistant from exactly two adjacent posts that provide the opposite polarity. The spacing between adjacent posts can be uniform across the core.

The posts can be uniformly spaced along a path that forms a closed loop.

In some implementations, the posts are positioned at vertices of a regular polygon. For example, as shown in FIG. 5A, for four posts the posts 124 can be positioned at the vertices of a square; as shown in FIG. 6A, for six posts the posts 124 can be positioned at the vertices of a hexagon, as shown in FIG. 6B for eight posts the posts 124 can be positioned at the vertices of an octagon. In these implementations, each post is equidistant from two adjacent posts with the opposite magnetic polarity.

In some implementations, the posts are positioned along linear segments of a rectangle. For example, as shown in FIGS. 6C and 6D, the posts 124 are spaced at even intervals along line segments 128. In some implementations, each vertex of the rectangle has a post 124.

The posts can be uniformly spaced in a regular two-dimensional array, e.g., a rectangular array.

Figure 6E:
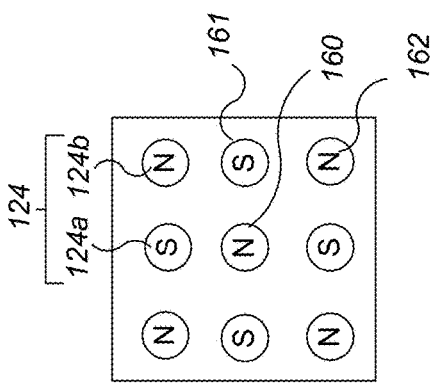
FIGS. 6A-6E are schematic top views of other implementations for a core.
Figure 6C:
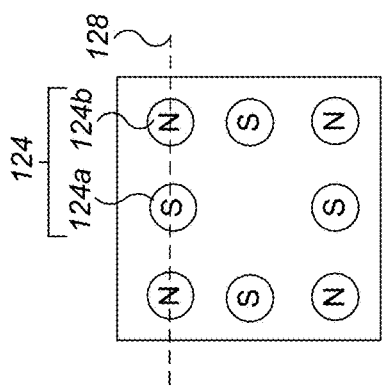
Figure 6D:
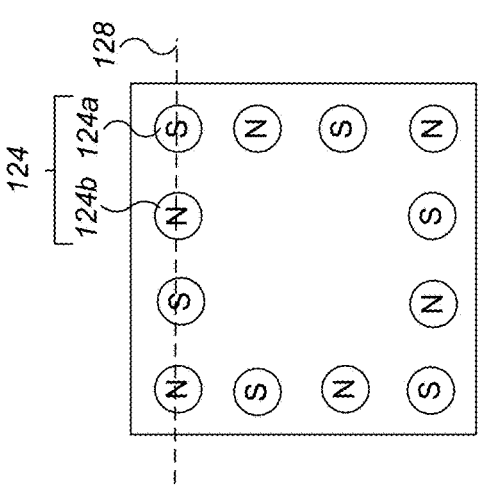
Figure 6A:
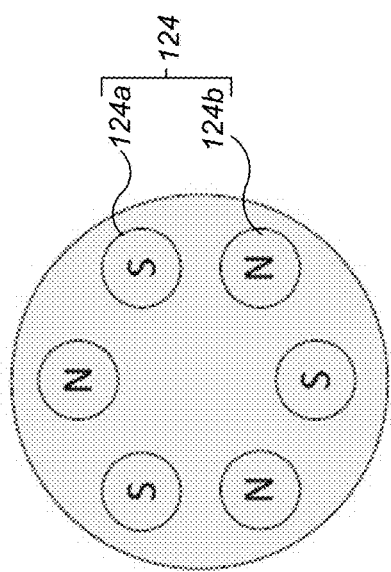
Figure 6B:
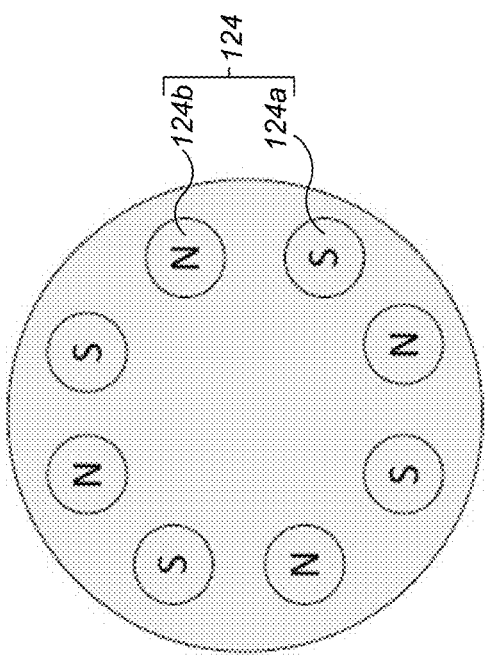

Referring to FIG. 6E, in some implementations, the post 124 are arranged in a pattern such that one or more of the posts are equidistant from three or more adjacent posts having the opposite polarity. For example, in the implementation shown in FIG. 6E, the center post 160 is equidistant from four posts 161 having the opposite polarity, and each edge post 161 is equidistant from three posts (including center post 160 and corner post 162). Some of the posts, e.g., corner posts 162, can equidistant from exactly two posts having the opposite polarity.

The back portion 120 can be disk-shaped, or can have a perimeter that generally follows the outermost posts 124, the perimeter can remain substantially equidistant from each post 124.

Although the posts 124 are illustrated a circular, they could be square, rectangular, hexagon, etc. Each post 124 has a width (W1, see FIG. 5C) which can be measured along a direction parallel to the top surface of the platen, e.g., parallel to the faces of the substrate and polishing pad during the polishing operation, and are substantially linear and extend in parallel to each other. The width of the posts 124 can be substantially the minimum possible while providing the necessary magnetic flux for a clear signal.

Returning to FIGS. 5B and 5C, each post 124 can be separated from an adjacent post 124 by a gap 126 having a width (W2). The width of the gap 126 can be substantially the minimum possible while providing room for the two winding assemblies 130 to fit around the respective posts 124 and in the gap 126. The width (W3) of a winding assembly 130 can be measured from the inside surface of the bobbin 132 to the outside surface of the tap 134 (assuming both elements are used in the winding assembly). The width W3 of a winding assembly can be at least 40%, e.g., about 45%, of the width W3 of the gap 126. Thus the total of the widths of the two winding assemblies together is at least 80%, e.g., about 90%, of the width W3 of the gap 126. In some implementations, the outer surface of a winding assembly 130 contacts the outside surface of an adjacent winding assembly 130.

In general, the in-situ electromagnetic inductive monitoring system 100 is constructed with a resonant frequency of about 50 kHz to 50 MHz. For example, for electromagnetic inductive monitoring system 100 shown in FIG. 4A, the coil 106 can have an inductance of about 0.1 to 50 microH, e.g., 0.75 uH, and the capacitor 162 can have a capacitance of about 47 pF to about 0.022 uF, e.g., 150 pF.

A core with multiple posts for alternating polarity magnetic fields (versus just having a single large center post) can be less sensitive during bulk polishing to metal features in underlying layers. Without being limited to any particular theory, where a substrate metal ring in an underlying layer, the opposite polarity posts cancel each other when they are over the rings, and hence the signal from any metal rings in underlying layers diminishes without negating the signal from the outer layer that is being polished.

The electromagnetic induction monitoring system can be used in a variety of polishing systems. Either the polishing pad, or the carrier head, or both can move to provide relative motion between the polishing surface and the substrate. The polishing pad can be a circular (or some other shape) pad secured to the platen, a tape extending between supply and take-up rollers, or a continuous belt. The polishing pad can be affixed on a platen, incrementally advanced over a platen between polishing operations, or driven continuously over the platen during polishing. The pad can be secured to the platen during polishing, or there can be a fluid bearing between the platen and polishing pad during polishing. The polishing pad can be a standard (e.g., polyurethane with or without fillers) rough pad, a soft pad, or a fixed-abrasive pad.

In addition, although the description above has focused on polishing, the core design can be applicable to in-situ monitoring during other substrate processing tools and steps that modify the thickness of the layer on the substrate, e.g., etching or deposition.

A number of embodiments of the invention have been described. Nevertheless, it will be understood that various modifications may be made without departing from the spirit and scope of the invention. Accordingly, other embodiments are within the scope of the following claims.

What is claimed is:

1. An apparatus for chemical mechanical polishing, comprising:
 a platen having a surface to support a polishing pad; and
 an electromagnetic induction monitoring system to generate a magnetic field to monitor a substrate being polished by the polishing pad, the electromagnetic induction monitoring system comprising a core positioned at least partially in the platen and a coil wound around a portion of the core, the core including
  a back portion, and
  a multiplicity of posts extending from the back portion in a first direction normal to the surface of the platen,
 wherein the core and coil are configured such that the multiplicity of posts comprise a first plurality of posts to provide a first magnetic polarity and a second plurality of posts to provide an opposite second magnetic polarity, the first plurality of posts and the second plurality of posts arranged in an alternating pattern, and wherein the multiplicity of posts are uniformly spaced along a path that forms a closed loop,
 wherein the electromagnetic induction monitoring system comprises a plurality of winding assemblies, each winding assembly including a coil portion wound around one of the multiplicity of posts, wherein each pair of adjacent posts is separated by a zap, wherein each winding assembly is a cylindrical body surrounding one of the multiplicity of posts,
 wherein each winding assembly comprises a width measured from an inside surface of the cylindrical body of the winding assembly to an outside surface of the cylindrical body of the winding assembly, and
 wherein a total of widths of a pair of adjacent winding assemblies of the plurality of winding assemblies in a particular gap between a respective pair of adjacent posts of the multiplicity of posts is at least 80% of a width of the particular gap.

2. The apparatus of claim 1, wherein the multiplicity of posts is evenly divided between the first plurality of posts and the second plurality of posts.

3. The apparatus of claim 1, wherein the multiplicity of posts are positioned at equidistant grids within and on edges of the closed loop.

4. The apparatus of claim 1, wherein the multiplicity of posts are positioned at vertices of a polygon.

5. The apparatus of claim 4, wherein the multiplicity of posts is four posts and the polygon is a square.

6. The apparatus of claim 4, wherein the multiplicity of posts is six posts and the polygon is a hexagon.

7. The apparatus of claim 1, wherein the multiplicity of posts are positioned along line segments of a rectangle.

8. The apparatus of claim 4, wherein each post is equidistant from two or more adjacent posts having an opposite magnetic polarity.

9. The apparatus of claim 4, wherein each post is equidistant from exactly two adjacent posts with the opposite magnetic polarity.

10. The apparatus of claim 1, the multiplicity of posts have the same height and cross-sectional shape.

11. The apparatus of claim 1, wherein the coil includes a plurality of coil portions, each coil portion of the plurality of coil portions wound around a different post of the multiplicity of posts.

12. The apparatus of claim 11, wherein the plurality of coil portions includes one or more first coil portions wound around one or more of the first plurality of posts and one or more second coil portions wound around one or more of the second plurality of posts.

13. The apparatus of claim 12, wherein the first coil portions and second coil portions are wound in opposite directions.

14. The apparatus of claim 12, wherein each post of the plurality of posts has an associated coil portion.

15. An apparatus for chemical mechanical polishing, comprising:
 a platen having a surface to support a polishing pad; and
 an electromagnetic induction monitoring system to generate a magnetic field to monitor a substrate being polished by the polishing pad, the electromagnetic induction monitoring system comprising a core positioned at least partially in the platen and a coil wound around a portion of the core, the core including
  a back portion, and
  a multiplicity of posts extending from the back portion in a first direction normal to the surface of the platen, and
  a plurality of winding assemblies, each winding assembly including one of a plurality of coil portions wound around one of the multiplicity of posts, wherein each pair of adjacent posts is separated by a gap; wherein each winding assembly forms a cylindrical body surrounding one of the multiplicity of posts,
 wherein each winding assembly comprises a width measured from an inside surface of the cylindrical body of the winding assembly to an outside surface of the cylindrical body of the winding assembly, and
 wherein a total of widths of a pair of adjacent winding assemblies of the plurality of winding assemblies in a particular gap between a respective pair of adjacent posts of the multiplicity of posts is at least 80% of a width of the particular gap.

16. The apparatus of claim 15, wherein the total width of the pair of adjacent winding assemblies in the particular gap is at least 90% of the width of the particular gap.

17. The apparatus of claim 15, wherein each winding assembly includes a bobbin, the coil is wound around the bobbin, and an inner surface of the bobbin provides inner diameter of the winding assembly.

18. The apparatus of claim 15, wherein each winding assembly includes a tape contacting and surrounding one of the plurality of coil portions, and an outer surface of the tape provides outer diameter of the winding assembly.

* * * * *

UNITED STATES PATENT AND TRADEMARK OFFICE
CERTIFICATE OF CORRECTION

PATENT NO. : 11,004,708 B2  
APPLICATION NO. : 15/727297  
DATED : May 11, 2021  
INVENTOR(S) : Hassan G. Iravani et al.

Page 1 of 1

It is certified that error appears in the above-identified patent and that said Letters Patent is hereby corrected as shown below:

In the Claims

Column 9, Line 40, in Claim 1, delete "uniformly," and insert --uniformly-- therefor.

Column 9, Line 40, in Claim 1, delete "zap," and insert --gap,-- therefor.

Column 10, Line 12, in Claim 10, after "claim 1", insert --wherein--.

Column 10, Line 46, in Claim 15, delete "gap;" and insert --gap,-- therefor.

Signed and Sealed this  
Twentieth Day of July, 2021

Drew Hirshfeld  
*Performing the Functions and Duties of the*  
*Under Secretary of Commerce for Intellectual Property and*  
*Director of the United States Patent and Trademark Office*